United States Patent
Rozsypal

(10) Patent No.: US 7,176,723 B2
(45) Date of Patent: Feb. 13, 2007

(54) TRANSLATOR CIRCUIT AND METHOD THEREFOR

(75) Inventor: Antonin Rozsypal, Hutisko-Solanec (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 142 days.

(21) Appl. No.: 11/060,691

(22) Filed: Feb. 18, 2005

(65) Prior Publication Data

US 2006/0186922 A1 Aug. 24, 2006

(51) Int. Cl.
*H03K 19/0175* (2006.01)
(52) U.S. Cl. .......................................... 326/83; 326/27
(58) Field of Classification Search ................. 326/26, 326/27, 63, 68, 81–86
See application file for complete search history.

(56) References Cited

U.S. PATENT DOCUMENTS

| 5,917,359 A  * | 6/1999  | Fukunaga et al. .......... 327/381 |
| 6,097,075 A    | 8/2000  | Rozsypal et al. |
| 6,664,822 B2 * | 12/2003 | Watabe ....................... 327/108 |
| 6,850,117 B2 * | 2/2005  | Weber et al. ................ 330/277 |

OTHER PUBLICATIONS

Data Sheet, "MC34025, MC33025 High Speed Double-Ended PWM Controller", On Semiconductor, Copyright Semiconductor Components Industries, L.L.C., Jul. 2003 -Rev. 6, pp. 1-20.
Data Sheet, 'IR2110L4, High and Low Side Driver, International Rectifier, PD-60085A, Apr. 23, 1999, pp. 1-14.

* cited by examiner

*Primary Examiner*—Don Le
(74) *Attorney, Agent, or Firm*—Robert F. Hightower

(57) ABSTRACT

In one embodiment, a voltage translator is configured to sense a change in a value of a supply voltage to the translator and responsively inhibit the translator from changing a state of the output of the translator.

17 Claims, 3 Drawing Sheets

TRANSLATOR CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various structures and methods to form floating high side drivers for power supply controllers and other power switching applications. Typically, the floating high side driver received power from a high voltage source and was referenced to a floating power node instead of being referenced to ground or other fixed reference voltage. One example of such a high side driver was a part manufactured by International Rectifier Corp. of El Segundo Calif. under the number IR2110. In some cases, the value of the high voltage source changed abruptly (often referred to as a high dv/dt). These abrupt changes often caused false triggering of the high side driver and improper operation of the power control system.

Accordingly, it is desirable to have a floating driver that has a high tolerance to abrupt voltage changes.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 1:
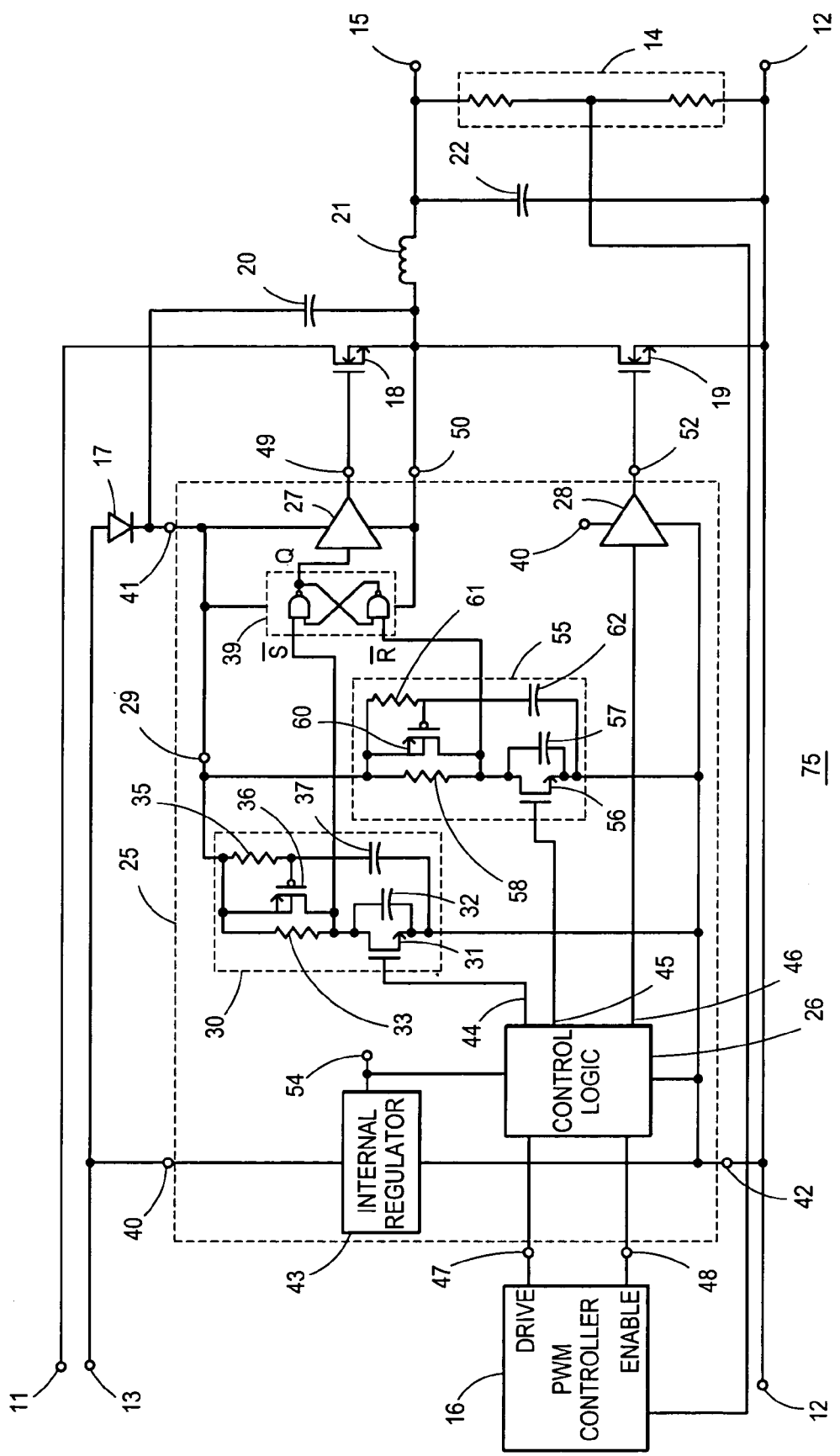
FIG. 1 schematically illustrates an embodiment of a portion of a power system that includes a floating high side driver in accordance with the present invention.

FIG. 1 schematically illustrates a portion of an embodiment of a power supply system 10 that includes a level shifter that is tolerant to abrupt voltage changes and especially tolerant of abrupt voltage changes on a power input of the level shifter. Power supply system 10 receives power from an external high voltage source between a first power input terminal 11 and a power return terminal 12, receives power from a low voltage source between a second power input terminal 13 and power return terminal 12, and forms a regulated output voltage between an output terminal 15 and terminal 12. Typically, the received power between terminals 11 and 12 is a bulk voltage such as a two hundred to six hundred volt (200–600 V) rectified sine wave from a household mains, and the received power between terminals 13 and 12 is a low voltage such as a ten to twenty volt (10–20 V) dc voltage. System 10 includes an upper power switch or power MOSFET or transistor 18, a lower power switch or power MOSFET or transistor 19, an energy storage inductor 21, a filter capacitor 22, a boost capacitor 20, a boost diode 17, a PWM controller 16, and a power MOSFET driver circuit 25. Controller 16, transistors 18 and 19, inductor 21, and capacitor 20 typically are external to circuit 25, however, in some embodiments controller 16 or transistors 18 and 19 or capacitor 20 may be formed as a portion of circuit 25. Circuit 25 is formed to receive a PWM drive signal and an enable signal from PWM controller 16 and responsively enable transistor 18 to charge inductor 21 and enable transistor 19 to discharge inductor 21. PWM controller 16 generates the PWM drive signal and the enable signal on respective drive and enable outputs of controller 16. Circuit 25 receives the PWM drive signal on an input 47 and the enable signal on an input 48. Controller 16 typically receives a feedback signal from a feedback network 14 that is representative of the value of the output voltage between terminals 15 and 12. Such PWM controllers and feedback networks are well known to those skilled in the art. One example of such a PWM controller is an MC34025 that is manufactured by ON Semiconductor of Phoenix Ariz. The voltage applied between terminals 13 and 12 causes diode 17 to conduct and charge capacitor 20. A terminal or boost return 50 of circuit 25 is connected to capacitor 20 to form a floating boost return that is used as a voltage return or reference for portions of circuit 25 instead of a fixed return such as terminal 12 as will be seen further hereinafter.

Circuit 25 includes a first transistor driver or high side transistor driver 27 that typically is operably coupled to drive transistor 18, a second transistor driver or low side transistor driver 28 that is typically operably coupled to drive transistor 19, a first level translator 30, a second level translator 55, control logic 26 that is utilized to control the signals from PWM controller 16 and form drive control signals that are received by translators 30 and 55, a high side control latch 39, and an internal operating voltage regulator or internal regulator 43. Circuit 25 receives the boost voltage as a first power supply voltage or first input voltage that is applied between a voltage input 41 and a voltage return 42. Return 42 typically is connected to terminal 12. Circuit 25 also receives the low voltage from terminal 13 as a second power supply voltage or second input voltage that is applied between a voltage input 40 and voltage return 42. Internal operating voltage regulator 43 generally is connected between input 40 and return 42 in order to receive the second input voltage and form an internal operating voltage on an output 54 that is used for operating the low voltage and control logic elements of circuit 25 such as logic 26. Driver 28 generally is connected to receive the voltage between input 40 and return 42. Driver 27 and latch 39 are connected between input 41 and boost return 50 so that the voltage return of driver 27 and latch 39 may float and use the voltage between input 41 and return 50 as a floating operating voltage. Translators 30 and 55, latch 39, and driver 27 typically are formed on a high voltage island of a semiconductor die that is electrically isolated from the portion of the semiconductor die on which logic 26, regulator 43, and driver 28 are formed. Such an electrically isolated high voltage island is described in U.S. Pat. No. 6,097,075 issued to Rozsypal et al on Aug. 1, 2000, which is hereby incorporated herein by reference.

First voltage level translator 30 and second voltage level translator 55 are utilized to shift the maximum voltage level of the control signals from logic 26 from being reference to a first voltage return, such as terminal 12, to being referenced to a second voltage return, such as return 50. Translators 30 and 55 are connected between input 41 and return 42 to receive the boost voltage as an operating voltage for translators 30 and 55 and to facilitate the translation. Translators 30 and 55 are formed to detect an abrupt change in the operating voltage of translators 30 and 55 and responsively disable translators 30 and 55 from changing state in response to the change in the operating voltage. Translator 30 includes a shift transistor 31 that has a parasitic drain-to-source capacitance 32, a shift resistor 33, a sense capacitor 37, a conversion resistor 35, and a by-pass transistor 36. Similarly, translator 55 includes a shift transistor 56 that has a parasitic drain-to-source capacitor 57, a shift resistor 58, a sense capacitor 62, a conversion resistor 61, and a bypass transistor 60. Translator 30 receives a first control signal from a first output 44 of logic 26 as an input signal, and translator 55 receives a second control signal from a second output 45 of logic 26 as an input signal. Outputs 44 and 45 generally form positive going pulses upon receiving the rising edge and upon receiving the falling edge of the signals on input 47. The width of the pulses are generally about one hundred (100) nsec wide in order to minimize power dissipation of circuit 25. Outputs 44 and 45 generally remain low after generating the pulses. Translators 30 and 55 invert the positive going pulses from respective outputs 44 and 45 and form negative going pulses. R-S latch 39 receives the shifted negative going control signal pulses from the outputs of translators 30 and 55, and responsively forms a shifted drive control signal on a Q output of latch 39. The shifted drive control signal on the Q output generally is representative of the drive signal on input 47 but shifted or translated in voltage. The shifted drive control signal from latch 39 is operable, through driver 27, to control transistor 18. Latch 39 is connected between input 41 and return 50 so that the output voltages from latch 39 are compatible with the input threshold voltages of driver 27.

In order to enable transistor 18 and disable transistor 19, logic 26 receives the drive signals on inputs 47 and 48 and responsively forms a positive going pulse on output 44, leaves output 45 low, and forces output 46 low. The low on output 46 forces the output of driver 28 low to begin disabling transistor 19. Since transistor 19 was previously enabled and is being disabled, the value of the boost voltage between input 41 and return 42 is approximately equal to the low voltage on input 13. The low on output 45 ensures that transistor 56 is disabled and allows resistor 58 to pull the negative level sensitive reset bar input (R bar) of latch 39 high to a voltage that is substantially equal to the value of the boost voltage on input 41 preventing the reset bar input from affecting latch 39. The high from the positive pulse on output 44 enables transistor 31 to pull the negative level sensitive set bar input (S bar) of latch 39 low to set latch 39. Since the set bar input goes low and the reset bar input is high, the short negative pulse from translator 30 sets latch 39, force the Q output and corresponding output 49 high to begin enabling transistor 18. Since transistor 31 is only on for the time that output 44 is high, the power dissipation of circuit 25 is minimized. When transistor 18 is enabled, a high voltage is switched to return 50 and a step in voltage is coupled to input 41 by capacitor 20 causing an abrupt increase in the value of the boost voltage at input 41. The amount of the increase of the voltage at input 41 may be as much as the value of the bulk voltage on input 11. The speed of the increase depends on the application including the value of inductance 21. The speed of the increase could be as high as 50V/ns. This is often referred to as a high dv/dt. The abrupt voltage change is coupled to input 29 of translators 30 and 55. Since transistor 31 is disabled, the abrupt voltage change is coupled across capacitor 32 and creates a current flow through resistor 33 in order to begin charging capacitor 32. The rapid voltage change forms a voltage change across resistor 35 and a resulting current flow through resistor 35 in order to begin charging capacitor 37. The voltage drop across resistor 35 due to the current flow to capacitor 37 forms a voltage drop across resistor 35 that enables transistor 36. Transistor 36 turns-on which begins conducting current to charge capacitor 32 and clamp the value of the voltage on the set bar input of latch 39 to a value substantially equal to the value of the boost voltage on input 41. Enabling transistor 36 prevents the rapid change in the value of the boost voltage on input 41 from falsely changing the state of latch 39 or the state of circuit 25 and prevents inaccurate operation of system 10. The rate of the abrupt change that is detected by translator 30 is adjustable by changing the value of resistor 35. Translator 30 typically senses a voltage change that is at least approximately ten volts/nsec (10V/nsec.) and responsively disables translator 30 from changing state.

Similarly, transistor 60, capacitor 62, and resistor 61 prevent the abrupt voltage change on input 41 from causing a voltage drop across resistor 58 and prevent the abrupt voltage change from affecting the reset bar input of latch 39 and from falsely changing the state of latch 39 or the state of circuit 25 and system 10.

In order to disable transistor 18 and enable transistor 19, logic 26 forms a positive going pulse on output 45, leaves output 44 low, and forces output 46 high. The positive pulse on output 45 enables transistor 56 which forces the negative level sensitive reset bar input (R bar) of latch 39 low to reset latch 39 and force the Q output low to begin disabling transistor 18. Transistor 31 remains disabled and allows resistor 33 to pull the set bar input (S bar) of latch 39 high to a voltage that is substantially equal to the value of the boost voltage on input 41 to prevent affecting latch 39.

To facilitate this operation, input 40 is coupled to the input of regulator 43. Output 54 of regulator 43 is coupled to the power input of logic 26. Input 41 is coupled to input 29 of translators 30 and 55, the power input of latch 39, and the power input of driver 27. Input 29 of translator 30 is commonly connected to the first terminal of resistor 35, the source of transistor 36, and a first terminal of resistor 33. A second terminal of resistor 35 is connected to the gate of transistor 36 and to a first terminal of capacitor 37. A second terminal of capacitor 37 is connected to return 42. A drain of transistor 36 is commonly connected to the set bar input of latch 39, a second terminal of resistor 33, and a drain of transistor 31 and a first terminal of the associated parasitic capacitor 32. A source of transistor 31 and the associated second terminal of capacitor 32 is connected to return 42, and a gate of transistor 31 is connected to output 44 of logic 26. Input 29 of translator 55 is commonly connected to a first terminal of resistor 58, a source of transistor 60, and a first terminal of resistor 61. A drain of transistor 60 is commonly connected to the reset bar input of latch 39, a second terminal of resistor 58, and a drain of transistor 56 and the associated first terminal of parasitic capacitor 57. A source of transistor 56 and the associated second terminal of parasitic capacitor 57 is connected to return 42. A gate of transistor 56 connected to output 45 of logic 26. A gate of transistor 60 is commonly connected to a second terminal of resistor 61 and a first terminal of capacitor 62. A second terminal of capacitor 62 is connected to return 42. The Q output of latch 39 is connected to an input of driver 27 which has an output connected to output 49 and a gate of transistor 18. The power return of latch 39 is connected to a power return of driver 27 and to boost return 50. A power input of driver 28 is connected to input 40 and a power return of driver 28 is connected to return 42. An input of driver 28 is connected to output 46 of logic 26 and an output of driver 28 is connected to output 52 and a gate of transistor 19. A first input of logic 26 is connected to input 47 to receive a first control signal from PWM controller 16. A second input of logic 26 is connected to input 48 to receive a second control signal from PWM controller 16. An output of regulator 43 is connected to the power input logic 26 which has a power return connected to return 42 and to a return of regulator 43. A first terminal of capacitor 20 is connected to input 41 and to a cathode of diode 17. A second terminal of capacitor 20 is connected to return 50, to a first terminal of inductor 21, to a source of transistor 18, and to a drain of transistor 19. The source of transistor 19 is connected to return 42 and to terminal 12. A drain of transistor 18 is connected to terminal 11. An anode of diode 17 is connected to terminal 13.

Figure 2:
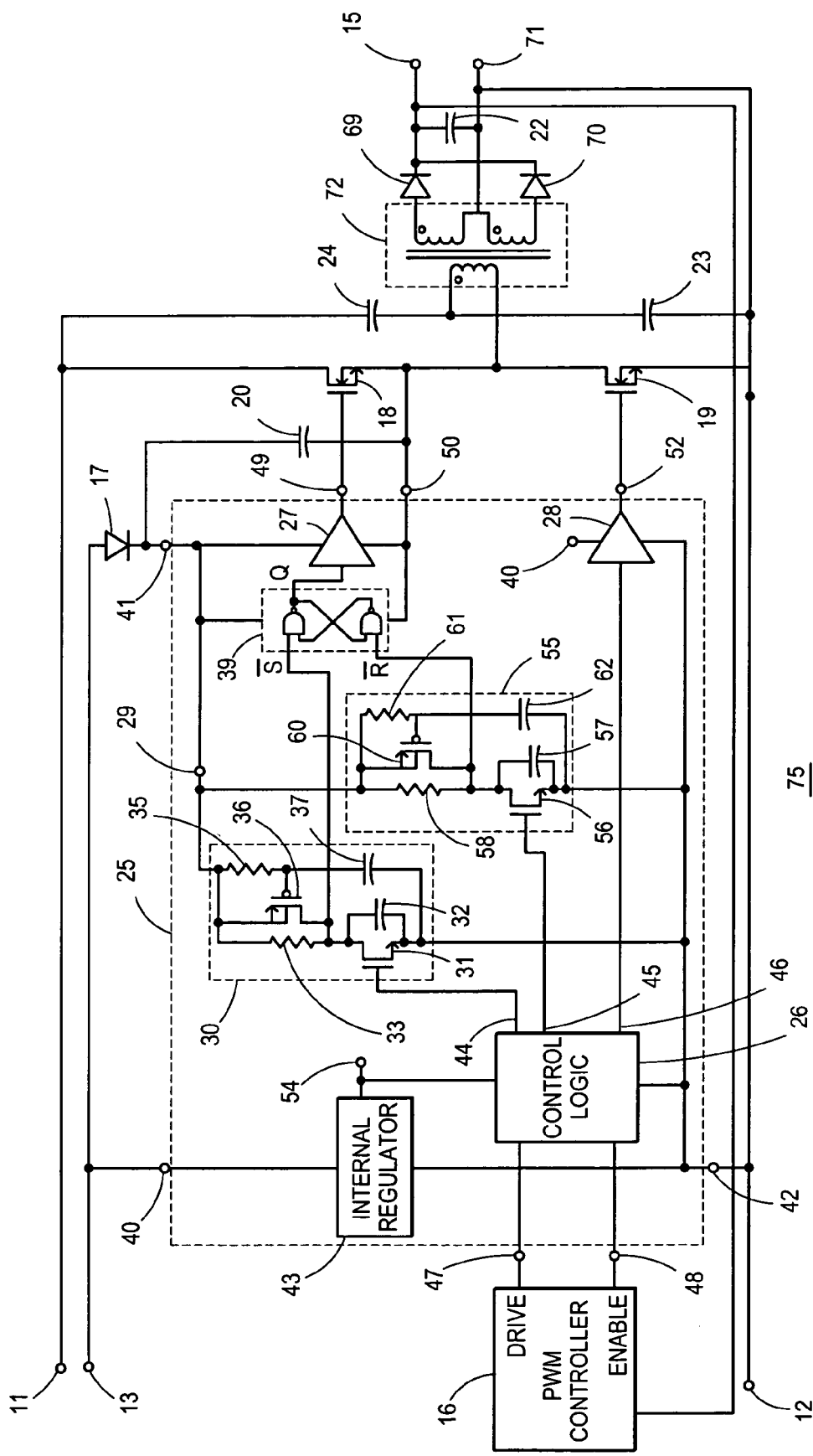
FIG. 2 schematically illustrates an embodiment of a portion of a power system that is an alternate embodiment of the system of FIG. 1 in accordance with the present invention.

FIG. 2 schematically illustrates a portion of an embodiment of a power supply system 75 that is an alternate embodiment of system 10 of FIG. 1. System 75 uses a transformer 72 instaed of inductor 21. When transistor 18 is enabled, the abrupt changes on input have even sharper edges than the changes of system 10. Translators 30 and 55 prevent the steep edges from the abrupt voltage change on input 41 from affecting the reset bar input of latch 39 and from falsely changing the state of latch 39 or the state of circuit 25 and system 75.

In one embodiment, a resistor is connected in series between the drain of transistor 36 and the drain of transistor 31 to improve parasitic signal rejection. Similarly, another resistor is connected in series between the drain of transistor 60 and the drain of transistor 56. Those skilled in the art will appreciate that additional such combinations of series resistors and transistors like transistor 36 may be added. Additionally, a zener diode may be connected in parallel with resistors 33, 35, 58, and 61 to protect circuit 25. Those skilled in the art will realize that capacitors 37 and 62 may be formed as a PN junction of a diode to the substrate on which circuit 25 is formed.

Figure 3:
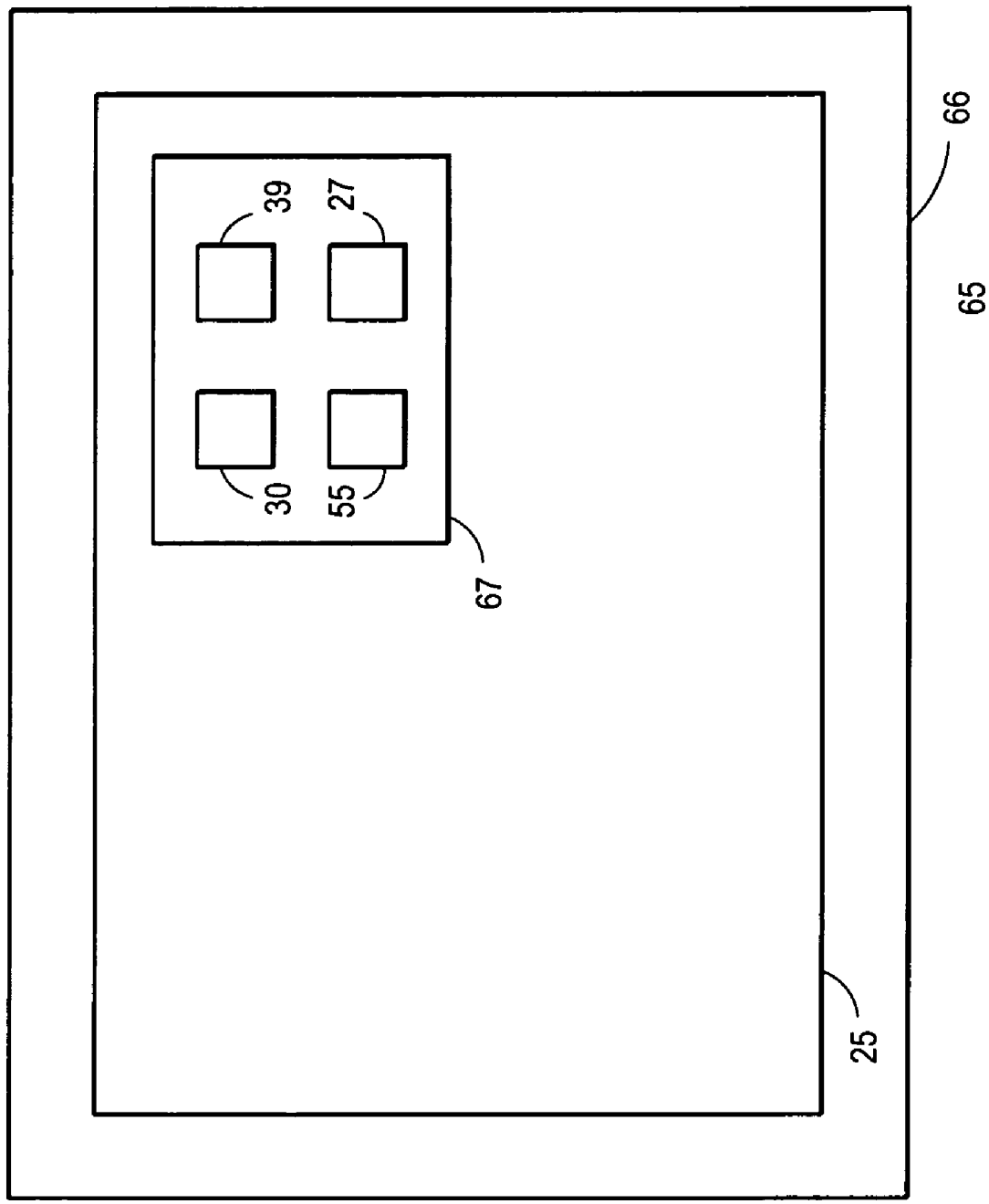
FIG. 3 illustrates a plan view of a semiconductor device that includes the high side floating driver of FIG. 1 in accordance with the present invention.

FIG. 3 schematically illustrates an enlarged plan view of a portion of an embodiment of a semiconductor device 65 that is formed on a semiconductor die 66. Circuit 25 is formed on die 66. Translators 30 and 55, latch 39, and driver 27 are formed on a high voltage island 67 that is formed on die 66. Die 66 may also include other circuits that are not shown in FIG. 2 for simplicity of the drawing. Circuit 25 and device 65 are formed on die 66 by semiconductor manufacturing techniques that are well known to those skilled in the art. As is described in U.S. Pat. No. 6,097,075, transistors 31 and 56 typically are formed along a border of a floating N-well region.

In view of all of the above, it is evident that a novel device and method is disclosed. Included, among other features, is forming a level shifter that senses an abrupt voltage change and disables the shifter from changing state due to the abrupt voltage change thereby preventing improper operation of the system that utilizes the shifter.

While the invention is described with specific preferred embodiments, it is evident that many alternatives and variations will be apparent to those skilled in the semiconductor arts. Those skilled in the art will note that internal regulator 43 may be connected to receive power from input 41 instead of input 40 thereby removing the need for input 40. Additionally, one sense resistor and capacitor may be used to control both transistors 36 and 60. For example resistor 35 and capacitor 37 may be connected to the gate of both transistors 36 and 60 instead of just to the gate of transistor 36. This facilitates sharing resistor 35 and capacitor 37 and reduces the cost of circuit 25.

Additionally, the invention has been described for a particular N-channel and P-channel MOS transistor structure, although the method is directly applicable to other transistors, such as bipolar transistors, BiCMOS, metal semiconductor FETs (MESFETs), HFETs, and other transistor structures. The word "connected" is used throughout for clarity of the description, however, it is intended to have the same meaning as the word "coupled". Accordingly, "connected" should be interpreted as including either a direct connection or an indirect connection.

The invention claimed is:

1. A method of forming a translator comprising:
configuring the translator to receive an input signal and shift a voltage value of the input signal to form an output signal operably coupled to control a power transistor coupled to an inductive load; and
configuring the translator to receive a supply voltage and inhibit the output signal from changing state responsively to a change in a value of the supply voltage including coupling a transistor to disable the translator from changing state responsively to the change in the supply voltage.

2. The method of claim 1 wherein configuring the translator to receive the supply voltage and inhibit the output signal from changing state responsively to the change in the value of the supply voltage includes configuring the translator to receive the supply voltage and inhibit the output signal responsively to a dv/dt produced by the inductive load.

3. The method of claim 2 wherein configuring the translator to receive the supply voltage and inhibit the output signal responsively to the dv/dt produced by the inductive load includes inhibiting the output signal responsively to the dv/dt of no less than approximately ten V/nsec.

4. The method of claim 1 wherein configuring the translator to receive the supply voltage and inhibit the output signal from changing state responsively to the change in the value of the supply voltage includes configuring the translator to clamp the output signal responsively to a voltage that is substantially equal to the value of the supply Voltage.

5. The method of claim 1 wherein configuring the translator to receive the supply voltage and inhibit the output signal responsively to the change in the value of the supply voltage includes configuring the translator to sense the supply voltage and inhibit the output signal from changing state responsively to the supply voltage changing at least approximately ten V/nsec.

6. The method of claim 1 wherein configuring the translator to receive the supply voltage and disable the output signal responsively to the change in the value of the supply voltage includes coupling a capacitor to sense the change in the supply voltage and responsively form a sense signal.

7. The method of claim 6 further including coupling the capacitor to form a current flow through a series connected resistor responsively to sensing the change in the supply voltage and responsively form the sense signal.

8. The method of claim 6 further including coupling a transistor to receive the sense signal and responsively clamp the output signal to a voltage that is substantially equal to the supply voltage.

9. A translator comprising:
- a first transistor coupled to receive an input signal having a first maximum voltage value and form an output signal having a second maximum voltage value that is greater than the first maximum voltage value; and
- a second transistor coupled to inhibit the translator from changing a state of the output signal responsively to sensing a first change in a value of an input voltage received by the translator.

10. The translator of claim 9 further including a first capacitor coupled to receive the first change in the value of the input voltage and responsively enable the second transistor.

11. The translator of claim 10 further including a first resistor coupled to receive a charging current of the first capacitor and form a voltage to enable the second transistor.

12. The translator of claim 11 wherein a first terminal of the first capacitor is coupled to a supply return, a second terminal is commonly coupled to a control electrode of the second transistor and a first terminal of the first resistor, a second terminal of the first resistor is coupled to receive the input voltage and to a first current carrying electrode of the second transistor, a second current carrying electrode of the second transistor is coupled to a first current carrying electrode of the first transistor, and a second current carrying electrode of the first transistor is coupled to the supply return.

13. The translator of claim 12 further including a second resistor having a first terminal coupled to receive the input voltage and a second terminal coupled to the first current carrying electrode of the second transistor.

14. A method for shifting a voltage level of a signal comprising:
- receiving an input signal;
- increasing a voltage value of the input signal to form an output signal;
- receiving a supply voltage having a first value;
- sensing a change in the first value of the supply voltage; and
- enabling a clamping circuit to disable the output signal from changing state responsively to detecting the change in the first value of the supply voltage.

15. The method of claim 14 wherein sensing the change in the first value of the supply voltage includes forming a charging current to a first capacitor responsively to the change in the first value of the supply voltage to responsively enable the clamping circuit.

16. The method of claim 15 further including directing the charging current through a resistor in series between the first capacitor and the supply voltage.

17. The method of claim 14 wherein sensing the change in the first value of the supply voltage includes sensing the change that is no less than about ten V/nsec.

* * * * *